United States Patent
Teshima et al.

(10) Patent No.: US 7,375,429 B2
(45) Date of Patent: May 20, 2008

(54) INTEGRATED CIRCUIT COMPONENT AND MOUNTING METHOD THEREOF

(75) Inventors: Yasuhiro Teshima, Kawasaki (JP); Noboru Nakama, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 190 days.

(21) Appl. No.: 11/321,811

(22) Filed: Dec. 29, 2005

(65) Prior Publication Data
US 2006/0108607 A1 May 25, 2006

Related U.S. Application Data

(63) Continuation of application No. PCT/JP03/11173, filed on Sep. 1, 2003.

(51) Int. Cl.
H01L 23/48 (2006.01)
H01L 21/44 (2006.01)

(52) U.S. Cl. ......... 257/738; 257/737; 257/772; 257/779; 257/E23.021; 257/E23.023; 257/E23.069; 438/613; 438/614; 438/615; 438/616; 438/617

(58) Field of Classification Search ........ 257/664, 257/665, 734–786, E29.111–E29.165, E23.01–E23.079, 257/E23.141–E23.179, E21.135–E21.21, 257/E21.627, E21.641; 438/571, 597, 666, 438/612–617
See application file for complete search history.

(56) References Cited

U.S. PATENT DOCUMENTS 6,228,682 B1 * 5/2001 Farooq et al. ............. 438/110

6,285,079 B1 * 9/2001 Kunikiyo ................. 257/737
6,713,871 B2 * 3/2004 Searls et al. .............. 257/738

FOREIGN PATENT DOCUMENTS

| JP | 63-056922 | 3/1988 |
|---|---|---|
| JP | 11-121899 | 4/1999 |
| JP | 2001-102512 | 4/2001 |
| JP | 2003-124430 | 4/2003 |

OTHER PUBLICATIONS

International Search Report dated Dec. 9, 2003.

* cited by examiner

*Primary Examiner*—Jasmine Clark
(74) *Attorney, Agent, or Firm*—Katten Muchin Rosenman LLP

(57) ABSTRACT

Disclosed are an integrated circuit component capable of simply mounting at low cost a chip part which adjusts impedance of wiring patterns as well as capable of effectively reducing switching noise from an integrated circuit, and a method for mounting the chip part. The integrated circuit component of the present invention has a constitution that a bypass capacitor is mounted on a wiring board side of a gap between the wiring board and an LSI chip. Therefore, as compared with a case where the capacitor is mounted on the LSI chip side, a transmission path through the capacitor can be extremely shortened. As a result, inductance components of the feeder line can be reduced, so that a response delay of power transmitted through the feeder line can be sufficiently suppressed.

12 Claims, 20 Drawing Sheets

INTEGRATED CIRCUIT COMPONENT AND MOUNTING METHOD THEREOF

CROSS-REFERENCE TO RELATED APPLICATIONS

This application is a continuing application, filed under 35 U.S.C. §111(a), of International Application PCT/JP2003/011173, filed Sep. 1, 2003.

BACKGROUND OF THE INVENTION

1. Field of the Invention

The present invention relates to an integrated circuit component constituted by mounting, on a wiring board having mounted thereon an integrated circuit module, a chip part which adjusts impedance of wiring patterns. The present invention also pertains to a method for mounting the chip part.

2. Description of the Related Art

As this type of integrated circuit component, there is conventionally known, for example, a component having a bypass capacitor as a chip part as shown in FIG. 15 or a component having a damping resistor as a chip part as shown in FIG. 16.

First, an integrated circuit component as shown in FIG. 15 is described. FIG. 15A is a sectional view of an integrated circuit component having a bypass capacitor, FIG. 15B is a sectional view taken along a line D-D of FIG. 15A, and FIG. 15C is a view in the direction of an arrow E of FIG. 15A.

As shown in these figures, an integrated circuit component 101 has a BGA (Ball Grid Array)-type LSI chip 110 (an integrated circuit module). An external terminal of the integrated circuit component 101 is formed by a plurality of solder bumps 111.

The LSI chip 110 is manufactured, for example, through a process as shown in FIG. 17. More specifically, the LSI chip 110 is manufactured by the following process. First, a BGA package substrate 113 having formed thereon land sections 112 constituting the external terminal is prepared (FIG. 17A). Further, flux 114 is coated on each of the land sections 112 (FIG. 17B). A solder ball 111' with a predetermined size is placed on the flux 114 (FIG. 17C). Further, the solder ball 111' is melted to allow the flux 114 to be volatilized. Thus, the LSI chip 110 having mounted thereon solder bumps 111 is obtained (FIG. 17D).

Turning now to FIG. 15, the integrated circuit component 101 is constituted by mounting a bypass capacitor 130 on a wiring board 120 having mounted thereon the LSI chip 110 by solder bonding. In order to prevent or suppress switching noise of the LSI chip 110, the bypass capacitor 130 is mounted near an outside of the LSI chip 110 in an LSI chip 110 mounting surface side of the wiring board 120, or is mounted on a wiring pattern 121 formed on an opposite surface side of the LSI chip 110 mounting surface. Further, the capacitor 130 adjusts inductance and impedance of the wiring pattern 121.

More specifically, accompanying fast switching of the LSI, power feed through the wiring patterns must also be performed at high speed. However, since response speed of the power itself cannot follow current fluctuation of the LSI and the response speed is delayed due to inductance components in a feeder line of the power, switching noise is generated. In order to prevent generation of the switching noise, the bypass capacitor 130 is placed near the LSI chip 110 as shown in the same figure to compensate for response delay of the power. Further, the inductance components of the wiring pattern 121 as a power supply line are reduced.

Next, an integrated circuit component as shown in FIG. 16 is described. FIG. 16A is a sectional view of an integrated circuit component having a damping resistor, FIG. 16B is a sectional view taken along a line F-F of FIG. 16A, and FIG. 16C is a view in the direction of an arrow G of FIG. 16A. In the figure, the same elements as those of FIG. 15 are indicated by the same reference numerals as in FIG. 15 and the description is omitted.

As shown in these figures, an integrated circuit component 102 is constituted by mounting a damping resistor 150 on a wiring board 140 having mounted thereon an LSI chip 110. In order to reduce switching noise or electromagnetic noise in transmission signals transmitted to and from the LSI chip 110, or to suppress reflection, overshoot or undershoot of transmission signals, the damping resistor 150 adjusts impedance of the wiring pattern 141 to realize the impedance matching.

A mounting position of the damping resistor 150 is preferably near an output terminal or input terminal (near a solder bump 111) of the transmission signals between the LSI chip 110 and the wiring board 140 in terms of performance of the impedance matching. Along with a recent tendency to increase capacity (speeding up) of the transmission signals, a rise time and fall time of the signal waveform is extremely reduced. As a result, the wiring pattern 141 which connects between the damping resistor 150 and the output terminal or the input terminal may be required to have a length of about several millimeters.

However, the length of the wiring pattern in the above-described constitution is as follows. As shown in each of FIGS. 15 and 16, each of the lengths L1 and L2 (including each length of vias 122 and 142 which connect between the wiring patterns) of the wiring patterns 121 and 141 equivalent to the sum of leaders of both electrodes in each chip part is about from 6 mm at the minimum to several dozen mm at the maximum. Each of the lengths L3 and L4 of the wiring patterns 121 and 141 in the connecting side with the LSI chip 110 is about 3 mm at the minimum. Practically, in the LSI chip 110, pins (solder bumps) as a connecting object with the chip part are scarcely positioned on the outermost periphery of the LSI chip 110 and are almost always positioned on the inner side of the LSI chip 110. Therefore, the real leader length of the wiring pattern from the LSI chip 110 is about 10 to 20 mm. Accordingly, each of the lengths L1 and L2 of the wiring patterns 121 and 141 equivalent to the sum of the leaders in both the electrodes becomes as long as about 10 to 25 mm. As a result, there is a problem that the above-described switching noise is easily generated due to the lengths of the wiring patterns 121 and 141.

To solve the above-described problem, there is proposed, for example, a capacitor mounting structure of mounting a bypass capacitor between a BGA-type integrated circuit device (an LSI chip) and a wiring board (see, e.g., Japanese Unexamined Patent Publication No. 2001-102512 (FIG. 1)).

FIG. 18A is a sectional view showing an outline of this capacitor mounting structure, and FIG. 18B is a sectional view taken along a line H-H of FIG. 18A. As shown in these figures, in a capacitor mounting structure 103, a bypass capacitor 173 is mounted so as to bridge predetermined adjacent solder pastes 172 among a plurality of solder bumps aligned on a mounting surface of an LSI chip 171. The LSI chip 171 is mounted on the wiring board 175 through other solder balls 174.

By thus mounting the bypass capacitor 173 between the LSI chip 171 and the wiring board 175, the bypass capacitor 173 is disposed near an integrated circuit, and as a result, the switching noise can be suppressed to some extent.

However, the technology described in Japanese Unexamined Patent Publication No. 2001-102512 (FIG. 1) has the following problems.

A first problem is as follows. That is, since a special process is required for the above-described mounting of the bypass capacitor 173 on the LSI chip 171 side, a manufacturing cost is increased. FIG. 19 shows an assumed manufacturing process of the LSI chip 171.

Specifically, the LSI chip 171 is manufactured by the following process. First, a BGA package substrate 183 having formed thereon land sections 182 constituting the external terminal is prepared (FIG. 19A). Further, in each of the land sections 182, special solder pastes 172' are printed on a place where the bypass capacitor 173 is mounted and predetermined solder pastes 184 are printed on the other places (FIG. 19B). Further, the bypass capacitor 173 is placed on the solder pastes 172' (FIG. 19C). Subsequently, a solder ball 174 is placed on the other solder pastes 184 (FIG. 19D). Further, these solder pastes are melted and reflowed. Thus, the LSI chip 171 having mounted thereon the bypass capacitor 173 and the solder balls 174 is obtained (FIG. 19E).

In the above-described manufacturing process, a necessary amount of solder paste is different between in a mounting place of the bypass capacitor 173 and in a mounting place of the solder ball 174. Therefore, a special stencil for printing is required. Further, no solder ball 174 is mounted on a mounting place of the bypass capacitor 173 irrespective of individual mounting or collective mounting. Therefore, a special tool is required. Thus, the manufacturing process has a technical/cost problem.

A second problem is as follows. That is, a scope of design is limited by designers and manufacturers.

More specifically, the designers and manufacturers which design an integrated circuit component containing a BGA-type integrated circuit module generally contracts out the integrated circuit module to a BGA mounting maker which specializes in BGA. Accordingly, a mounting position, number and characteristics of a bypass capacitor or a damping resistor must be previously determined at the time of order placement and therefore, are difficult to be changed later. Particularly in the damping resistor, a problem may occur in a characteristic assessment after the manufacture of the first lot due to shortage of characteristic investigation in designing of a wiring board or due to variation in characteristics of LSI. Therefore, a change of constants which specifies the characteristics may be required. However, in the case of mounting the damping resistor on the integrated circuit module side, coordination with the BGA mounting maker is necessary in changing the constants. As a result, any action may not be easily taken due to problems such as a period or cost.

A third problem is as follows. That is, when mounting the bypass capacitor between the LSI chip and the wiring board, the feeder line remains long. FIG. 20A is an enlarged sectional view showing an essential part of the capacitor mounting structure 103 which indicates this problem. FIG. 20B is a sectional view taken along a line I-I of FIG. 20A.

As shown in FIG. 20A, power transmitted through a power supply line 191 which constitutes wiring patterns of the wiring board 175 is transmitted to the bypass capacitor 173 through a via 192, a pad 193 and a solder paste 172. Further, the power reaches a ground line 196 through a solder paste 172, a pad 194 and a via 195. In short, the power is transmitted in a mode of once making a long detour toward the LSI chip 171 side. Therefore, the response speed of the power is delayed due to inductance components in the transmission path of the power, and as a result, an effect of reducing switching noise cannot be greatly obtained.

SUMMARY OF THE INVENTION

In view of the foregoing, it is an object of the present invention to provide an integrated circuit component capable of easily mounting at low cost a chip part which adjusts impedance of wiring patterns as well as capable of effectively reducing switching noise from an integrated circuit. It is another object of the present invention to provide a method for mounting the chip part.

To accomplish the above objects, according to one aspect of the present invention, there is provided an integrated circuit component, comprising: an integrated circuit module with an external terminal formed by a plurality of metal bumps, a wiring board having a plurality of wiring patterns and an external connecting terminal to be connected to a part of the wiring patterns, the wiring board mounting thereon the integrated circuit module by connecting the metal bumps to the external connecting terminal, and a chip part which adjusts impedance of the wiring patterns, the chip part being mounted on the wiring board side of a gap between the wiring board and the integrated circuit module so as to be mounted between adjacent metal bumps among the plurality of metal bumps.

According to another aspect of the present invention, there is provided a method for mounting, on a wiring board having a plurality of wiring patterns and an external connecting terminal to be connected to a part of the wiring patterns, an integrated circuit module with an external terminal formed by a plurality of metal bumps and a chip part which adjusts impedance of the wiring patterns. The method comprises the steps of: forming as the external connecting terminal of the wiring board a footprint, between any adjacent footprints on which the metal bumps are placed, for mounting the chip part so as to be disposed in a gap between the wiring board and the integrated circuit module, simultaneously mounting metal pastes on the respective footprints, mounting the chip part on the metal pastes, mounting the integrated circuit module on the metal pastes through the metal bumps so as to cover the chip part, and melting the metal pastes to bond the integrated circuit module and the chip part to the wiring board by reflow soldering.

The above and other objects, features and advantages of the present invention will become apparent from the following description when taken in conjunction with the accompanying drawings which illustrate preferred embodiments of the present invention by way of example.

DESCRIPTION OF THE PREFERRED EMBODIMENTS

Figure 1A:
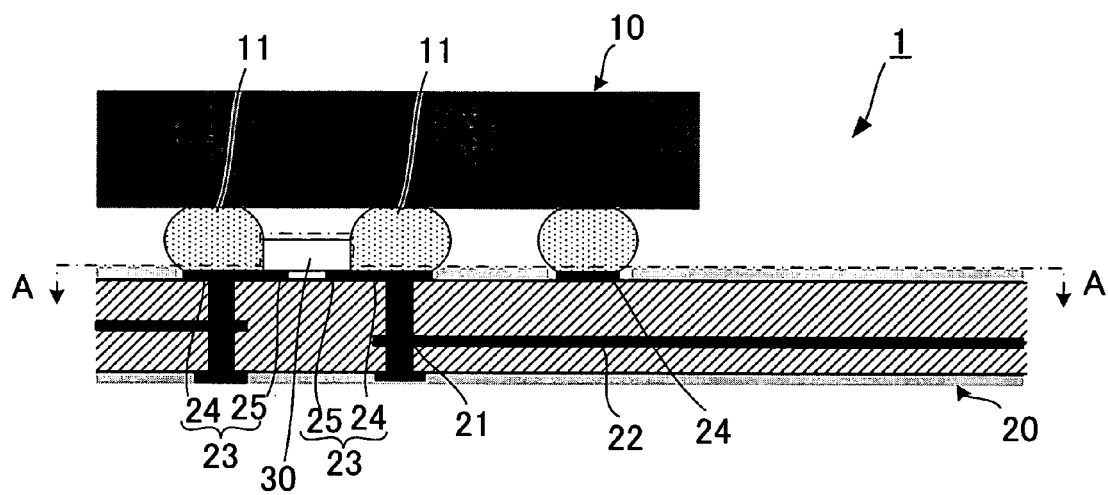
FIG. 1 illustrates a mounting structure of an integrated circuit component according to a first embodiment of the present invention.

Preferred embodiments of the present invention will be described in detail below with reference to the accompanying drawings, wherein like reference numerals refer to like elements throughout.

First Embodiment

A first embodiment of the present invention will be described.

Figure 1B:
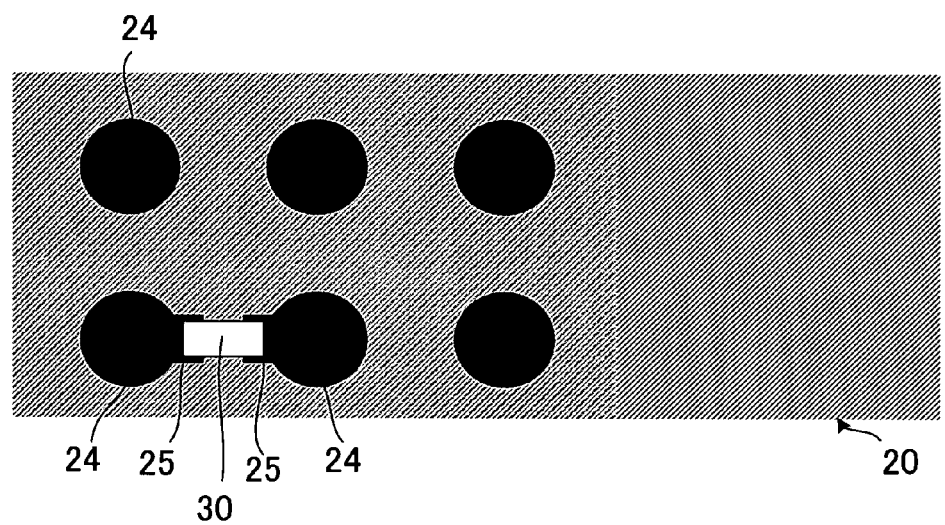

The present embodiment relates to an integrated circuit component constituted by mounting a BGA-type LSI chip and a bypass capacitor on a wiring board. FIG. 1 illustrates a mounting structure of the integrated circuit component. FIG. 1A is a sectional view of FIG. 1. FIG. 1B is a sectional view taken along a line A-A of FIG. 1.

As shown in FIG. 1A, an integrated circuit component 1 is composed of a BGA-type LSI chip 10 (an integrated circuit module) and a wiring board 20 for mounting the LSI chip 10 through solder bumps 11 (metal bumps).

In the LSI chip 10, a plurality of the solder bumps 11 are formed in a line on a surface of the LSI chip 10 to be mounted on a wiring board 20. These solder bumps 11 constitutes an external terminal of the chip 10. A mounting method of the solder bumps 11 in a manufacturing process of the LSI chip 10 is performed by reflow through the solder paste in the same manner as in the above-described mounting method shown in FIG. 17. The LSI chip 10 itself does not constitute an essential part of the present invention and is publicly known. Therefore, description of the internal structure is omitted.

On the other hand, the wiring board 20 is constituted by laminating a plurality of dielectric layers inside which a plurality of vias 21 run through and a plurality of metal layers which contain a plurality of wiring patterns 22 and external connecting terminals 23. The wiring patterns 22 contain signal lines, ground lines and power supply lines. A part of the wiring patterns 22 is connected to the external connecting terminal 23 through the via 21.

As shown in FIG. 1B, on a surface of the wiring board 20 facing the LSI chip 10, a plurality of circular footprints 24 are formed corresponding to the solder bumps 11. Further, between predetermined adjacent footprints 24, oblong footprints 25 extending along the adjacent direction of the footprints 24 are formed. These footprints 24 and 25 constitute the external connecting terminals 23.

Further, on the wiring board 20 side of a gap between the wiring board 20 and the LSI chip 10, a bypass capacitor 30 is mounted to bridge the adjacent footprints 25. In the same figure, there is shown an example where the bypass capacitor 30 is bridged in the shortest adjacent direction (in a lateral direction in the same figure) of the solder bumps 11 aligning in a lattice form. As described above, within an area of the wiring board 20 for mounting the LSI chip 10, the bypass capacitor 30 is mounted between the solder bumps 11 bonded to the predetermined adjacent footprints 24. Further, each electrode of the capacitor 30 is electrically continuous with the wiring pattern 22 through the footprint 25.

With respect to fillets (parts protruding from the bypass capacitor 30) of the footprints 25, it is preferred that the fillets are omitted in the longitudinal direction of connecting both the electrodes of the bypass capacitor 30, in other words, in the adjacent direction of the adjacent footprints 25 and are provided only in the direction perpendicular to the adjacent direction. FIG. 2 shows a relation between the bypass capacitor 30 and the fillets 25a of the footprints 25.

Figure 2A:
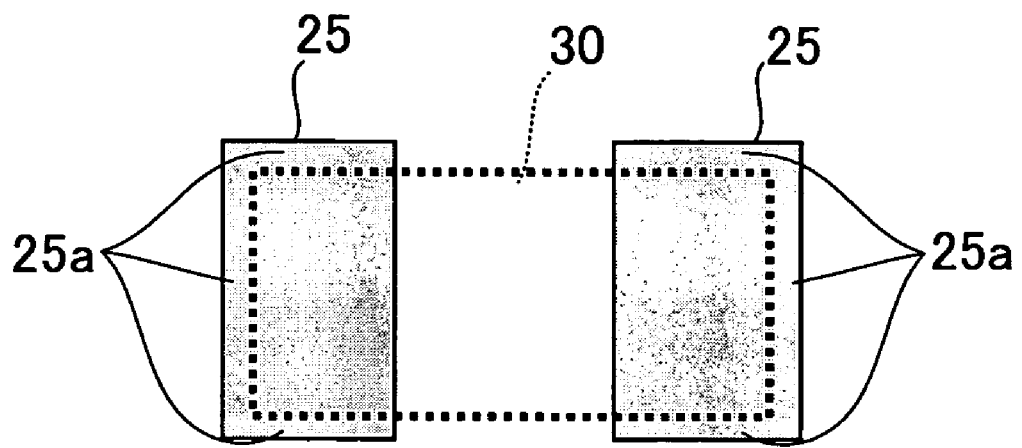
FIG. 2 illustrates a relation between a chip part and footprints for mounting the chip part.

More specifically, as shown in FIG. 2A, the fillets 25a of the footprints 25 are generally required for connection reliability securement of the bypass capacitor 30 or for appearance inspection for confirming the securement. However, when the fillets 25a are formed also in the longitudinal direction of connecting both the electrodes of the bypass capacitor 30, a defect such as chip rising is worried. In other words, when mounting the bypass capacitor 30 on the wiring board 20, solder pastes are previously printed on the footprints 25 and then reflowed. Therefore, when the solder pastes are excessively provided in the longitudinal direction, a fillet formation balance between the footprints is easily disturbed due to deviation in a component mounting position. Further, when the fillet formation balance is disturbed, great tension occurs only in one footprint. As a result, the bypass capacitor 30 may incline to cause one end thereof to rise. Accordingly, it is preferred that no fillet 25a is provided in the longitudinal direction of connecting both the electrodes of the bypass capacitor 30.

On the other hand, as long as the fillets 25a are provided only in the direction perpendicular to the longitudinal direction of connecting both the electrodes of the bypass capacitor 30, no problem occurs in terms of the connection reliability. In the present embodiment, the bypass capacitor 30 is provided in a gap between the wiring board 20 and the LSI chip 10, so that the appearance inspection itself cannot be performed. Therefore, there is no need to place a high value on formal procedures. Accordingly, the fillets 25a may be provided only in the direction perpendicular to the longitudinal direction of connecting both the electrodes of the bypass capacitor 30.

Figure 2B:
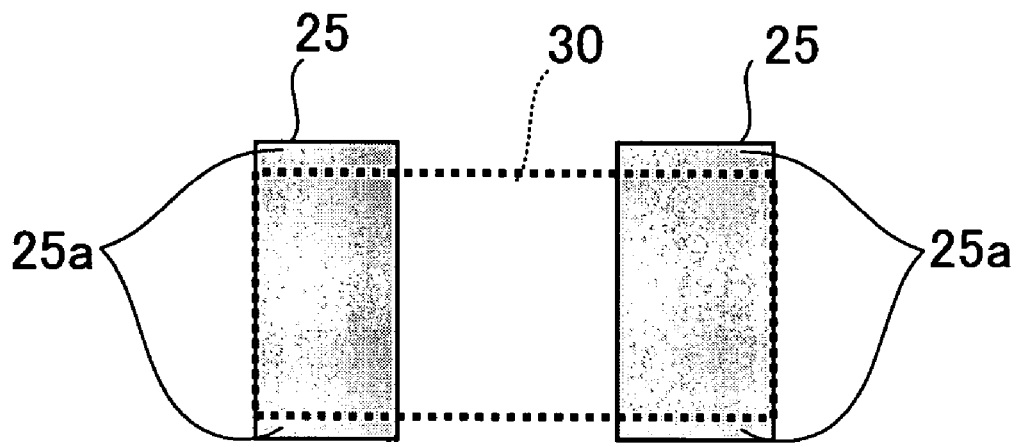

In terms of the above-described standpoints, the fillets 25a are provided only in the direction perpendicular to the longitudinal direction of connecting both the electrodes of the bypass capacitor 30 as shown in FIG. 2B. For formation modes of the footprints, some variations as shown in FIG. 3 can be considered.

Figure 3A:
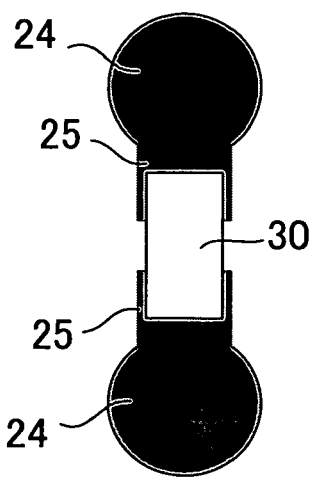
FIG. 3 illustrates variations of a formation mode of footprints.
Figure 3B:
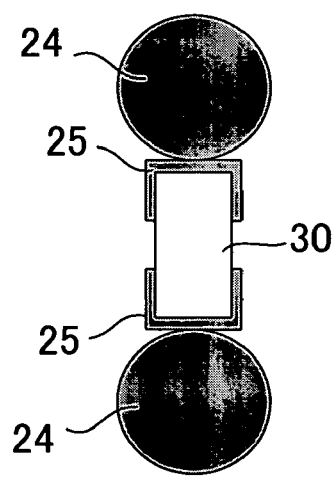
Figure 3C:
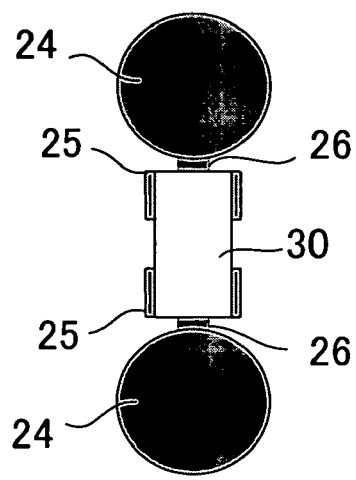

For example, as shown in FIG. 3A, the footprint 24 and the footprint 25 can be integrally formed. Further, as shown in FIG. 3B, the footprint 24 and the footprint 25 may be disposed to come into contact with each other. Further, as shown in FIG. 3C, the fillet 25a in the longitudinal direction of connecting both the electrodes of the bypass capacitor 30 may be removed as described above to perform connection between the footprint 24 and the footprint 25 through the wiring pattern 26.

Figure 4A:
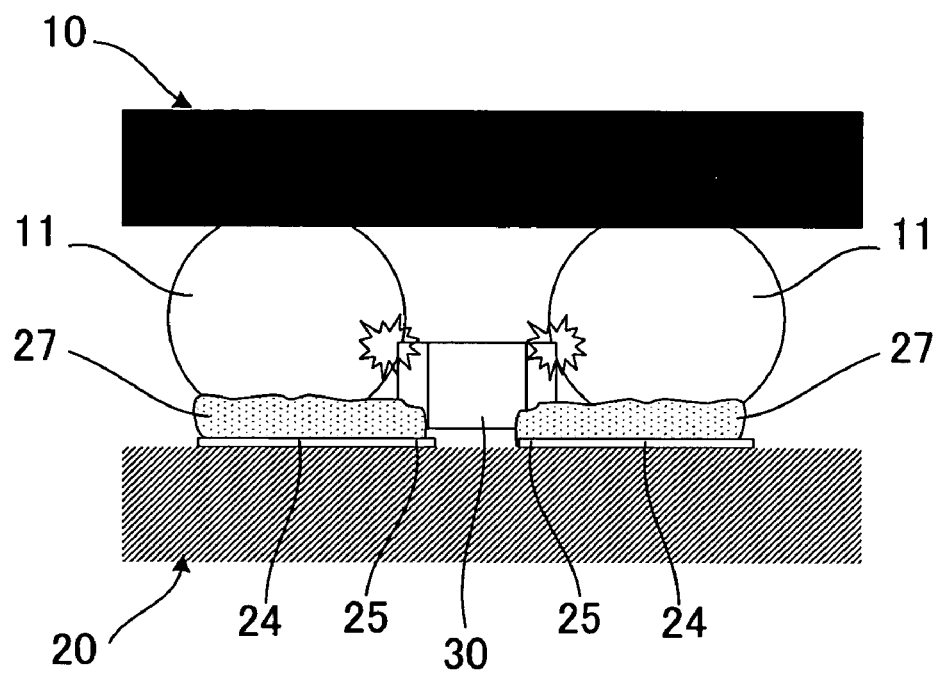
FIG. 4 illustrates notices in mounting an integrated circuit module on a wiring board.

Further, as shown in FIG. 4, when mounting the LSI chip 10 on the wiring board 20, solder pastes 27 are printed on the footprints 24 and 25 (the external connecting terminal) on the wiring board 20. Thereafter, the bypass capacitor 30 is mounted on the pastes 27 and then, the LSI chip 10 is mounted from above the capacitor 30. Subsequently, the capacitor 30 and the LSI chip 10 are bonded by reflow soldering to the wiring board. At this time, when the bypass capacitor 30 comes into contact with any one of the adjacent solder bumps 11 before the reflow as shown in FIG. 4A, deviation in a component mounting position or inclination of the component may occur. As a result, even if the capacitor 30 and the LSI chip 10 are bonded by reflow soldering to the wiring board, defective mounting such as deviation of chip and LSI chip may occur.

Figure 4B:
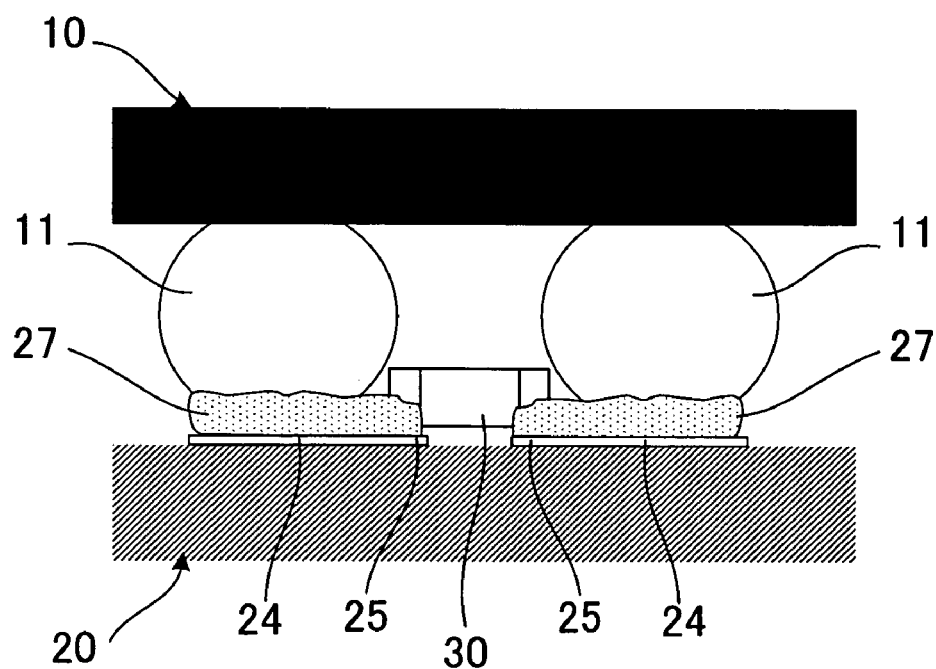

Therefore, as shown in FIG. 4B, a positional relationship between the bypass capacitor 30 and the LSI chip 10 must be set such that the bypass capacitor 30 and the adjacent solder bumps 11 are prevented from coming into contact with each other at least before the reflow. It is considered that even if the melted solder bumps 11 and a part of the bypass capacitor 30 come into contact with each other after the reflow (or during a final stage of the reflow), no particular problem arises.

Figure 5A:
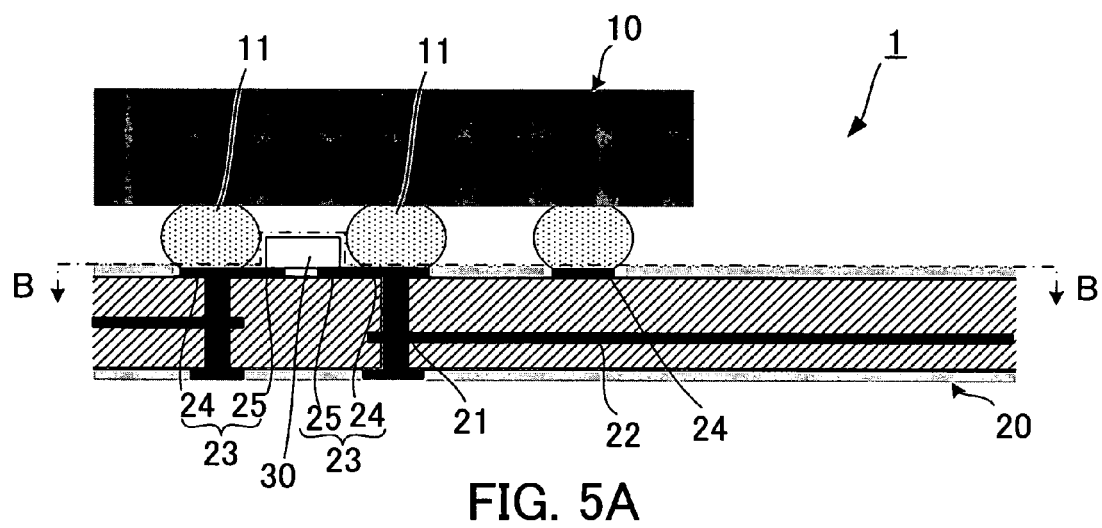
FIG. 5 illustrates another mounting structure of an integrated circuit component according to a first embodiment of the present invention.
Figure 5B:
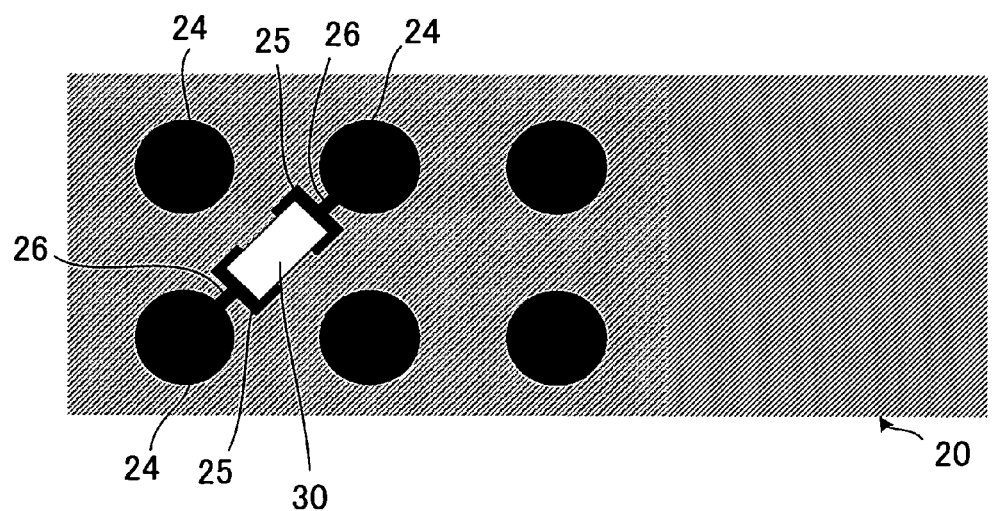

Next, an example in which the bypass capacitor 30 is bridged in the obliquely adjacent direction of the solder bumps 11 aligning in a lattice form will be described with reference to FIG. 5. FIG. 5A is a sectional view of the integrated circuit component. FIG. 5B is a sectional view taken along a line B-B of FIG. 5A. The same elements as those in the example of the shortest adjacent direction shown in FIG. 1 are indicated by the same reference numerals as in FIG. 1 and the description is omitted.

As shown in FIG. 5B, for convenience of a size of the bypass capacitor 30 or of a transmission path, the bypass capacitor 30 must be occasionally bridged not in the shortest adjacent direction of the solder bumps 11 but in the obliquely adjacent direction thereof.

Also in such a case, the same constitution as that in FIG. 1 can be realized when disposing the footprints 25 along the adjacent direction of the obliquely adjacent footprints 24. In the same figure, there is shown an example in which the footprints 24 and 25 are connected through the wiring pattern 26. Also in this case, since the footprint 25 and the footprint 24 have the same node, no problem arises even if the solder bump 11 and the bypass capacitor 30 are approximated to each other.

Figure 6A:
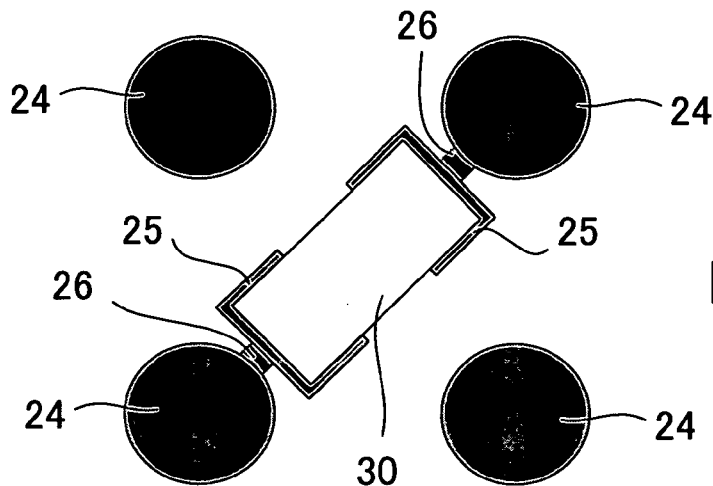
FIG. 6 illustrates variations of oblique mounting of a chip part.
Figure 6B:
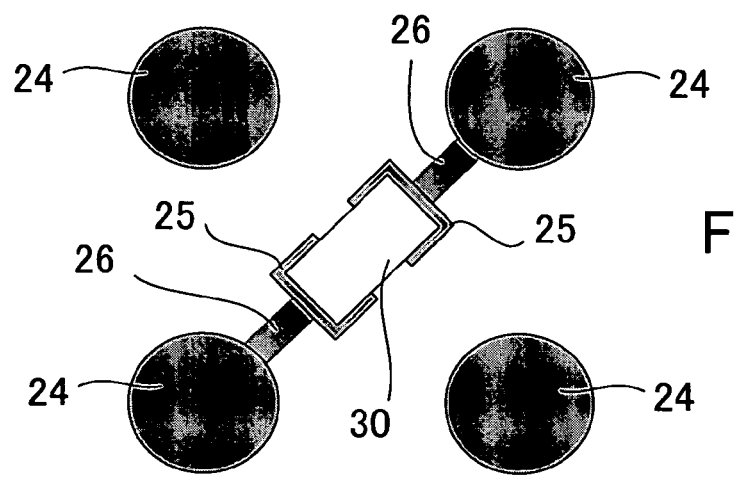
Figure 6C:
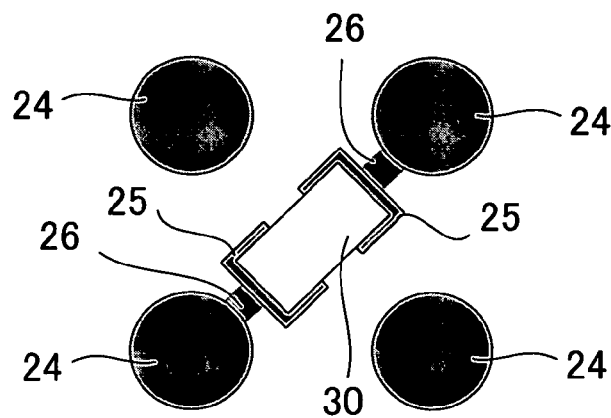

Such an oblique mounting constitution is applicable to various footprint sizes as shown in FIG. 6. FIG. 6A shows a case of mounting a relatively large bypass capacitor 30 between the solder bumps 11 which are disposed in a predetermined interval and size. FIG. 6B shows a case of mounting a relatively small bypass capacitor 30. FIG. 6C shows a case of mounting a relatively small bypass capacitor 30 between the solder bumps 11 which are disposed in a relatively small interval.

Figure 7A:
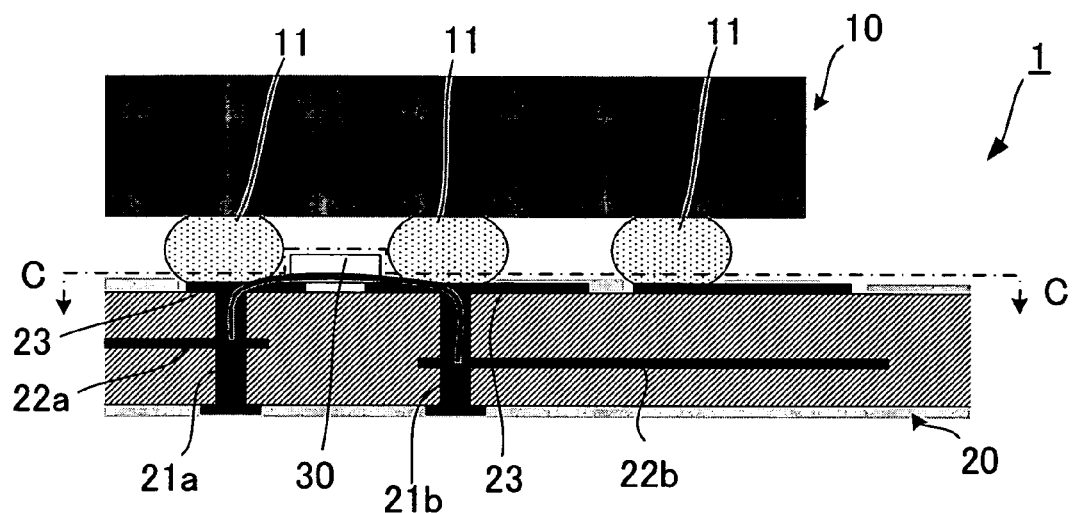
FIG. 7 illustrates a working effect of a first embodiment.
Figure 7B:
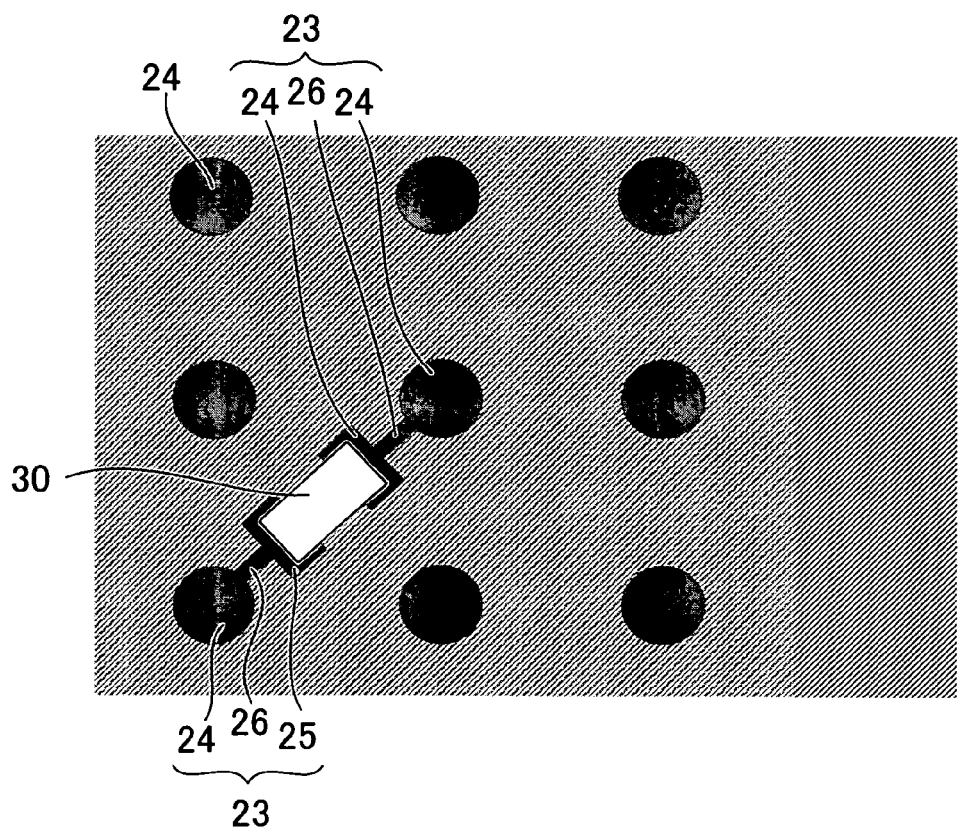

As described above, according to the integrated circuit component 1 of the present embodiment, the bypass capacitor 30 is mounted on the wiring board 20 side of a gap between the wiring board 20 and the LSI chip 10. Therefore, as compared with a case where the bypass capacitor 30 is mounted on the LSI chip 10 side, a transmission path which goes through the bypass capacitor 30 can be extremely shortened. FIG. 7 illustrates a working effect of the present embodiment. FIG. 7A is an enlarged sectional view showing an essential part of the integrated circuit component 1. FIG. 7B is a sectional view taken along a line C-C of FIG. 7A.

As shown in FIG. 7A, power transmitted through a power supply line 22a which constitutes wiring patterns of the wiring board 20 is transmitted to the bypass capacitor 30 through a via 21a and an external connecting terminal 23 (footprints 24 and 25). Further, the power supply reaches a ground line 22b through an external connecting terminal 23 and a via 21b. In short, the power is transmitted via the shortest path on the bypass capacitor 30 side. Therefore, a feeder line through the wiring patterns can be extremely shortened, so that inductance components of the feeder line can be reduced. As a result, a response delay of the power transmitted through the feeder line can be sufficiently suppressed, so that generation of switching noise can be greatly reduced.

Further, since the bypass capacitor 30 is mounted on the wiring board 20 side, a designer and manufacturer side of the integrated circuit component 1 can appropriately perform design changes of the bypass capacitor 30 particularly when contracting out the LSI chip 10 side. As a result, manufacture of the whole integrated circuit component 1 can be simply and rapidly performed at low cost.

In the above description, an example of mounting the bypass capacitor 30 as a chip part is given. When mounting, for example, a damping resistor as a chip part, the chip part can be approximated to an output terminal or input terminal (a solder bump 11) of the LSI chip 10. Therefore, impedance matching between the output side or input side of the LSI chip 10 and the wiring patterns can be performed with high accuracy.

Second Embodiment

Next, a second embodiment of the present invention will be described. The present embodiment has the same constitution as in the first embodiment except for being different from the first embodiment in the mounting mode of the chip part. Therefore, in the figure, the same elements as those of the first embodiment are indicated by the same reference numerals as in the first embodiment, if necessary, and the description is omitted. FIG. 8 illustrates a mounting surface of the chip part of the present embodiment.

Figure 8A:
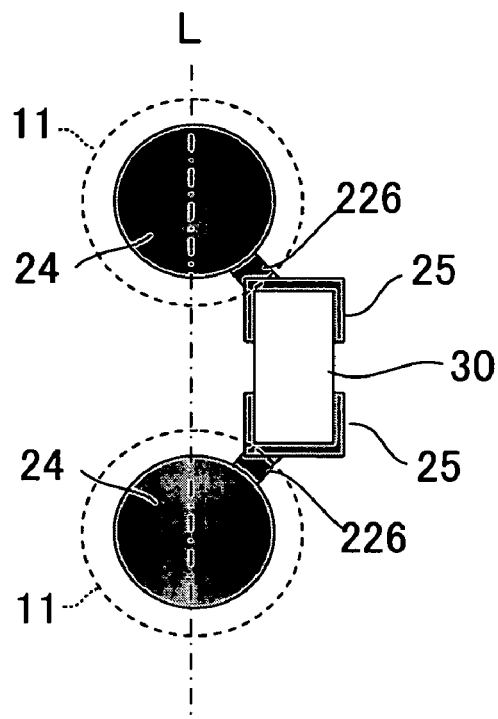
FIG. 8 illustrates a mounting surface of a chip part of a second embodiment.

As shown in FIG. 8A, in the integrated circuit component of the present embodiment, the bypass capacitor 30 (the chip part) is mounted in a position at a distance from an axis line L (a dashed line in the figure) along an adjacent direction of the adjacent solder bumps 11 (a broken line in the figure).

Specifically, the integrated circuit component of the present embodiment is applicable to the following case. That is, depending on a size of the solder bump 11, an interval between the adjacent solder bumps 11 and a size of the bypass capacitor 30, the bypass capacitor 30 interferes with the adjacent solder bumps 11 when being mounted between the adjacent solder bumps 11. At the same time, the bypass capacitor 30 is required to be mounted between the specified solder bumps 11. In the above-described case, the capacitor 30 is mounted at a distance from the axis line L. In short, on a surface of the wiring board 20, the footprints 25 and 25 for mounting the bypass capacitor 30 are formed in a position on one side at a predetermined distance from the axis line L of connecting the footprints 24 for mounting the adjacent solder bumps 11. The corresponding footprints 24 and 25 are connected through a wiring pattern 226 extending in the direction at a distance from the axis line L.

Figure 8B:
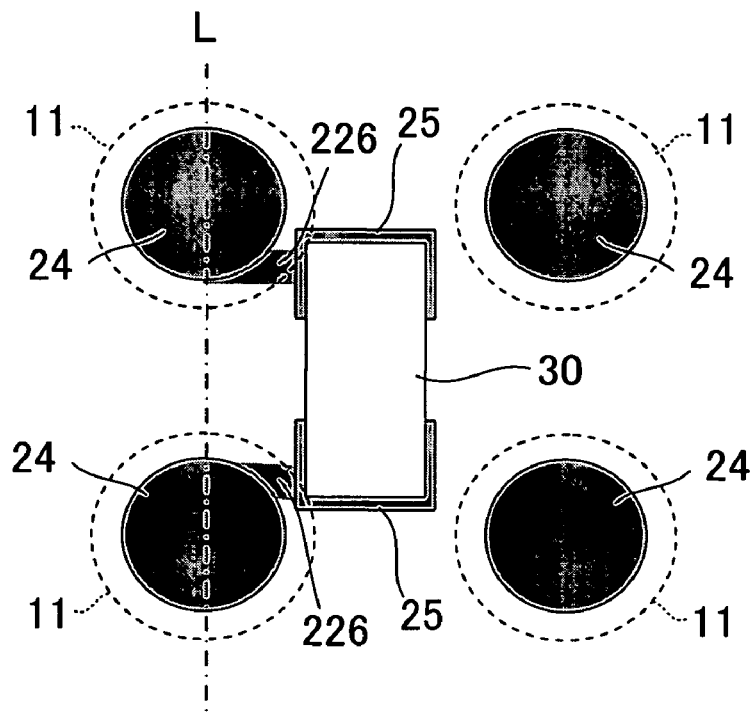

Further, when the bypass capacitor 30 is more increased in size against the solder bump 11, the wiring pattern 226 may be formed to extend from the footprint 24 in the direction perpendicular to the axis line L, and the footprint 25 may be formed at the end of the wiring pattern 226, for example, as shown in FIG. 8B. However, on this occasion, the bypass capacitor 30 is mounted so as not to interfere with other adjacent solder bumps 11.

Next, a mounting process of the bypass capacitor 30 of the present embodiment will be described with reference to FIGS. 9 and 10. FIG. 9 illustrates a flow of the mounting process. FIG. 10 is an enlarged view showing an essential part of the mounting process.

Figure 9A:
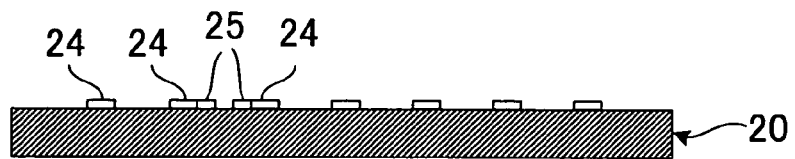
FIG. 9 illustrates a flow of a mounting process of an integrated circuit component.

As shown in FIG. 9, between any adjacent footprints 24 on which the solder bumps 11 are placed, the footprint 25 as the external connecting terminal of the wiring board 20 is first formed for mounting the bypass capacitor 30 (FIG. 9A).

Figure 9B:
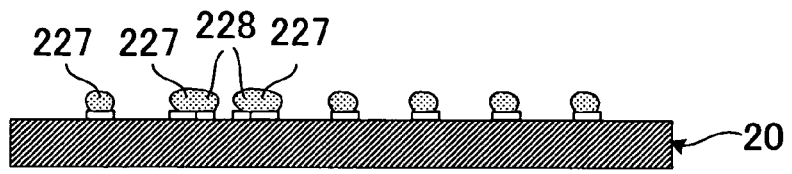
Figure 10A:
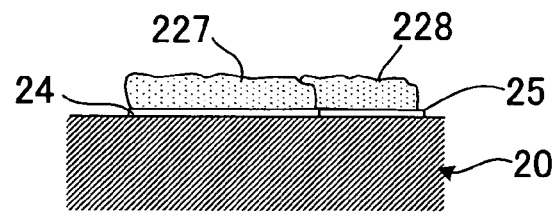
FIG. 10 is an enlarged view showing an essential part of FIG. 9.

Further, the solder pastes 227 and 228 are collectively printed on these footprints 24 and 25, respectively (FIGS. 9B and 10A).

Figure 9C:
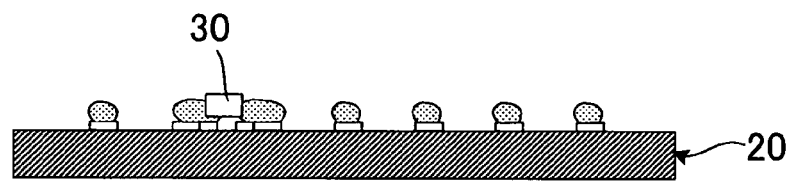
Figure 9D:
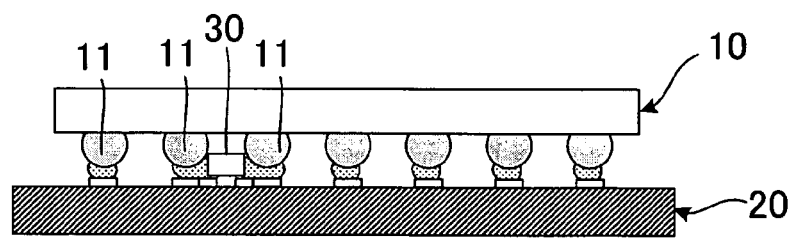
Figure 10B:
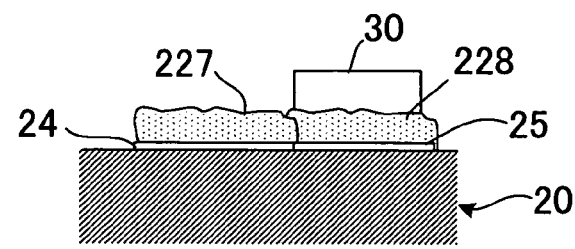
Figure 10C:
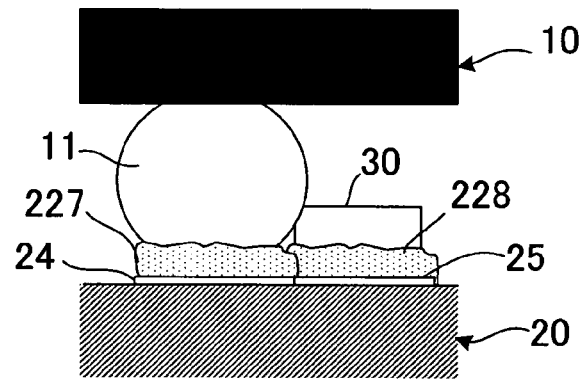

Subsequently, the bypass capacitor 30 is placed and mounted on the solder pastes 228 (FIGS. 9C and 10B). Thereafter, the LSI chip 10 is mounted such that each of the solder bumps 11 is placed on the solder paste 227 (FIGS. 9D and 10C). At this time, the bypass capacitor 30 is mounted between the wiring board 20 and the LSI chip 10 so as to be covered by the LSI chip 10.

Figure 9E:
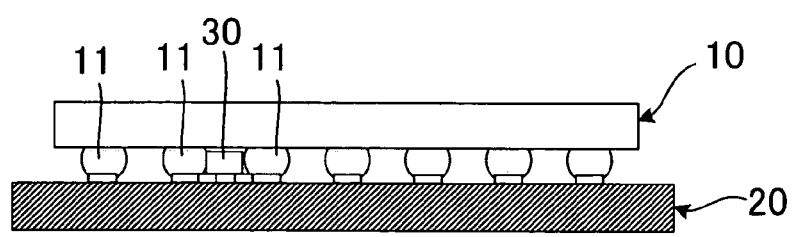
Figure 10D:
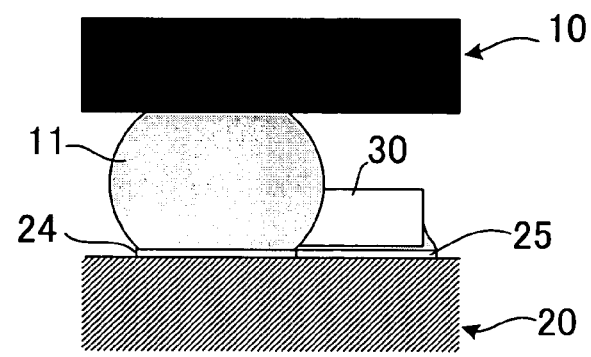

Further, each solder paste is melted and reflowed, whereby the bypass capacitor 30 and the LSI chip 10 are bonded to the wiring board 20 (FIGS. 9E and 10D).

Thus, the mounting process is completed.

As described above, also in the integrated circuit component of the present embodiment, the bypass capacitor 30 is mounted on the wiring board 20 side of a gap between the wiring board 20 and the LSI chip 10. Therefore, the same effect as in the first embodiment can be obtained.

Further, on the wiring board 20, the bypass capacitor 30 is mounted in a position on one side at a predetermined distance from the axis line L of connecting the adjacent solder bumps 11. Therefore, there can be realized mounting according to a size of the solder bump 11, an interval between the adjacent solder bumps 11 and a size of the bypass capacitor 30.

Also in the present embodiment, an example of mounting the bypass capacitor 30 as the chip part is given. Further, the present embodiment is similarly applicable also to a case of mounting other chip parts such as a damping resistor.

Third Embodiment

Next, a third embodiment of the present invention will be described. The present embodiment has the same constitution as in the first embodiment except for being different from the first embodiment in the mounting mode of the chip part. Therefore, in the figure, the same elements as those of the first embodiment are indicated by the same reference numerals as in the first embodiment, if necessary, and the description is omitted. FIG. 11 illustrates a mounting surface of the chip part of the present embodiment.

Figure 11A:
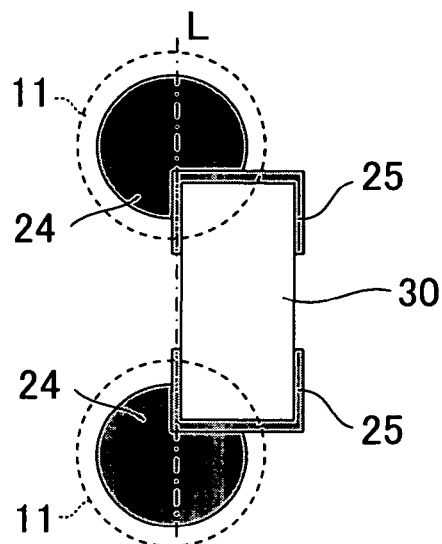
FIG. 11 illustrates a mounting surface of a chip part of a third embodiment.

As shown in FIG. 11A, also in the integrated circuit component of the present embodiment, the bypass capacitor 30 (the chip part) is mounted in a position at a distance from an axis line L (a dashed line in the figure) along an adjacent direction of the adjacent solder bumps 11 (a broken line in the figure) in the same manner as in the second embodiment.

Specifically, on a surface of the wiring board 20, the footprints 25 and 25 for mounting the bypass capacitor 30 are formed so as to be superimposed on the respective footprints 24 and 24 in a position on one side at a predetermined distance from the axis line L of connecting the footprints 24 on which the adjacent solder bumps 11 are placed. Then, the bypass capacitor 30 is mounted on the footprints 25 and 25. On this occasion, the bypass capacitor 30 is mounted so as not to interfere with other adjacent solder bumps 11.

Next, a mounting process of the chip part of the present embodiment will be described with reference to FIGS. 11 and 12. FIG. 12 is an enlarged view showing an essential part of the mounting process.

As shown in FIG. 12, the footprints 25 for mounting the bypass capacitor 30 are first formed between any adjacent footprints 24 for mounting the solder bumps 11. Further, the solder pastes 327 and 328 are collectively printed on these footprints 24 and 25, respectively (FIG. 12A).

Figure 11C:
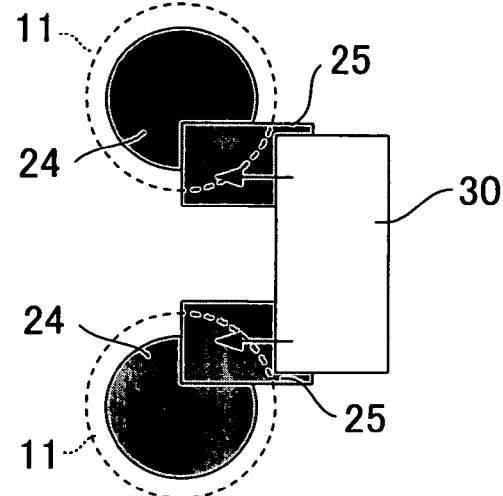
Figure 11B:
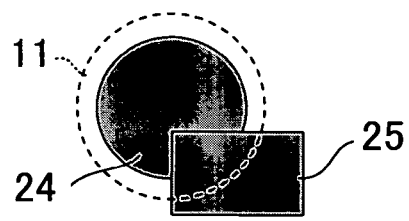
Figure 11B:
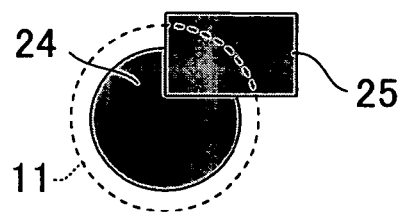

At this time, as shown in FIG. 11B, the footprints 25 are formed in a position on one side at a predetermined distance from the axis line L so as to be obliquely superimposed on the footprints 24. Accordingly, in this case, the wiring patterns 226 as shown in FIG. 8 are not formed between the footprints 24 and 25.

Figure 12A:
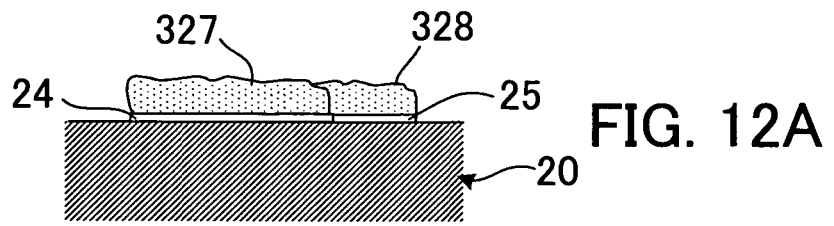
FIG. 12 illustrates a flow of a mounting process of an integrated circuit component.
Figure 12B:
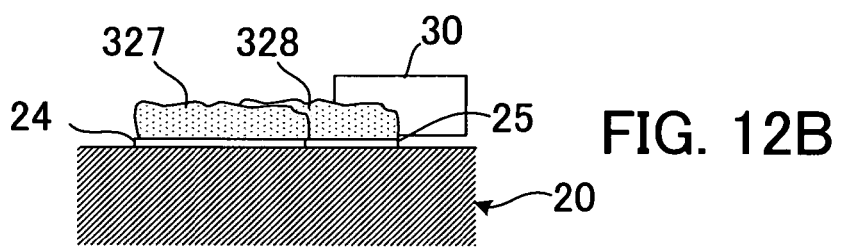
Figure 12C:
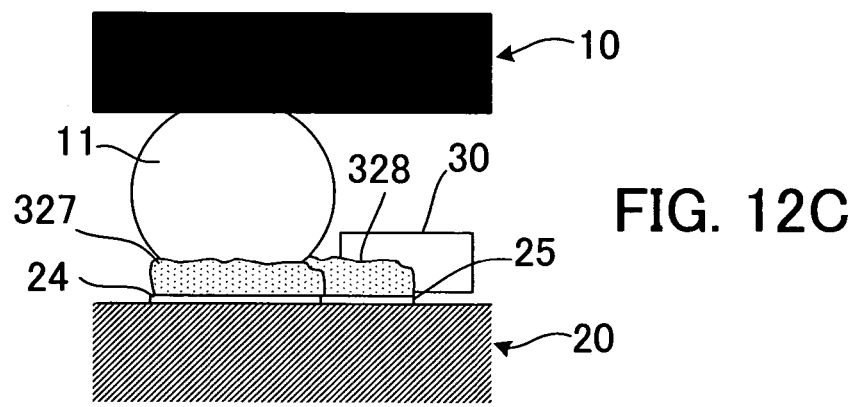

Turning now to FIG. 12, subsequently, the bypass capacitor 30 is placed on the solder pastes 328 in a position more deviated to the one side direction (FIG. 12B). Thereafter, the LSI chip 10 is mounted such that each of the solder bumps 11 is placed on the solder paste 327 (FIG. 12C). At this time, the bypass capacitor 30 is mounted between the wiring board 20 and the LSI chip 10 so as to be covered by the LSI chip 10. On this occasion, a positional relationship between the bypass capacitor 30 and the solder bumps 11 (in other words, a positional relationship between the footprints 24 and 25) is set such that the bypass capacitor 30 is prevented from coming into contact with each of the adjacent solder bumps 11.

Figure 12D:
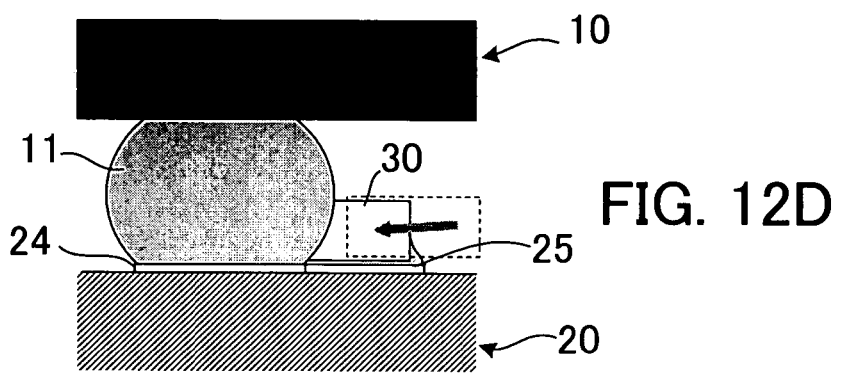

Further, each solder paste is melted and reflowed. At this time, as indicated by an arrow in the figure, the bypass capacitor 30 is automatically moved to a predetermined position of the footprint 25 by the self-alignment due to surface tension of solder during the reflow and bonded to the wiring board (FIGS. 12D and 11C).

Thus, mounting of the bypass capacitor 30 and the LSI chip 10 on the wiring board 20 is completed.

As described above, also in the integrated circuit component of the present embodiment, the bypass capacitor 30 is mounted on the wiring board 20 side of a gap between the wiring board 20 and the LSI chip 10. Therefore, the same effect as in the first embodiment can be obtained.

Further, on the wiring board 20, the bypass capacitor 30 is mounted in a position on one side at a predetermined distance from the axis line L of connecting the adjacent solder bumps 11 as well as the bypass capacitor 30 is disposed at a farther distance from the solder bumps 11 before a reflow step. In the present embodiment, the bypass capacitor 30 is disposed at a farther distance of one third to one half the width of the bypass capacitor 30.

That is, the integrated circuit component of the present embodiment has a constitution such that the bypass capacitor 30 is mounted in a proper position in the final stage of the reflow step. Therefore, even in the case where the bypass capacitor 30 somewhat interferes with the solder bumps 11 when being mounted as in the second embodiment, the bypass capacitor 30 and the LSI chip 10 can be mounted in a proper position in the final stage of the reflow step. As a result, a bypass capacitor 30 larger than that of the second embodiment can be mounted.

Also in the present embodiment, an example of mounting the bypass capacitor 30 as the chip part is given. Further, the present embodiment is similarly applicable also to a case of mounting other chip parts such as a damping resistor.

Fourth Embodiment

Next, a fourth embodiment of the present invention will be described. The present embodiment has the same constitution as in the first embodiment except for being different from the first embodiment in the mounting mode of the chip part. Therefore, in the figure, the same elements as those of the first embodiment are indicated by the same reference numerals as in the first embodiment, if necessary, and the description is omitted. FIG. 13 illustrates a mounting surface of the chip part of the present embodiment.

Figure 13A:
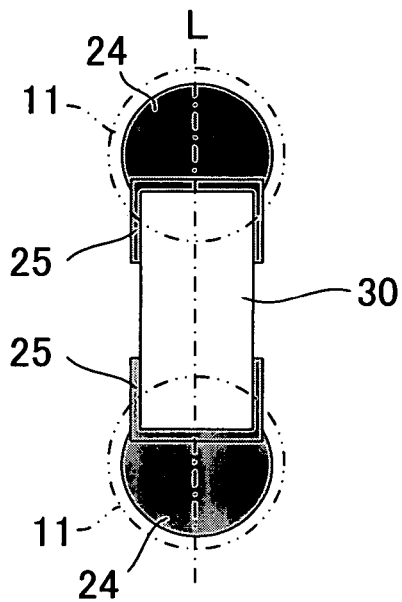
FIG. 13 illustrates a mounting surface of a chip part of a fourth embodiment.

As shown in FIG. 13A, in the integrated circuit component of the present embodiment, the bypass capacitor 30 (the chip part) is mounted on the axis line L (a dashed line in the figure) along the adjacent direction of the adjacent solder bumps 11 (a chain double-dashed line in the figure). This mounting is realized by the above-described self-alignment during the reflow.

Next, a mounting process of the chip part of the present embodiment will be described with reference to FIGS. 13 and 14. FIG. 14 is an enlarged view showing an essential part of the mounting process.

As shown in FIG. 14, the footprints 25 for mounting the bypass capacitor 30 are first formed between any adjacent footprints 24 on which the solder bumps 11 are placed. Further, solder pastes 427 are collectively printed on these footprints 24 and 25, respectively (FIG. 14A).

Figure 13C:
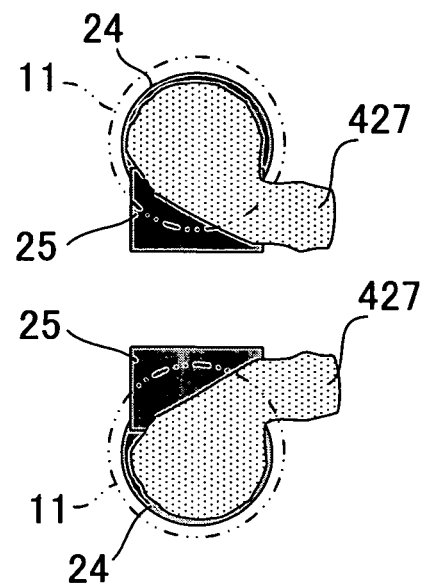
Figure 13B:
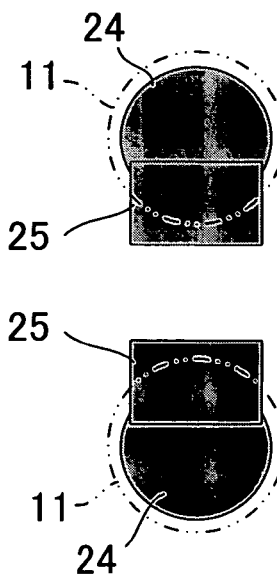

At this time, as shown in FIG. 13B, the footprints 25 are formed so as to be superimposed on the footprints 24 along the axis line L. As shown in FIG. 13C, the solder pastes 427 are then mounted up to a position at a predetermined distance from the footprints 25 so that the bypass capacitor 30 can be placed.

Figure 13D:
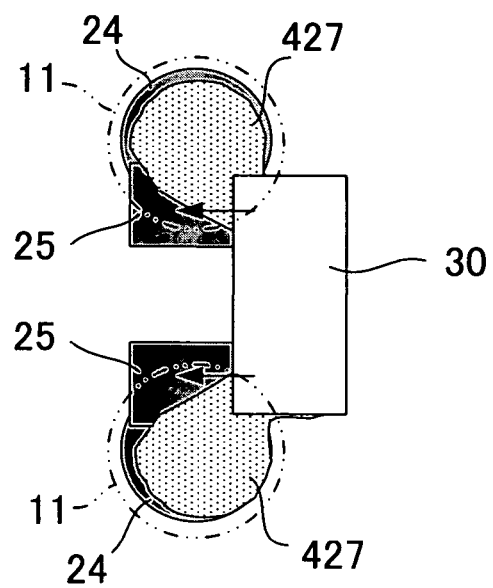
Figure 14A:
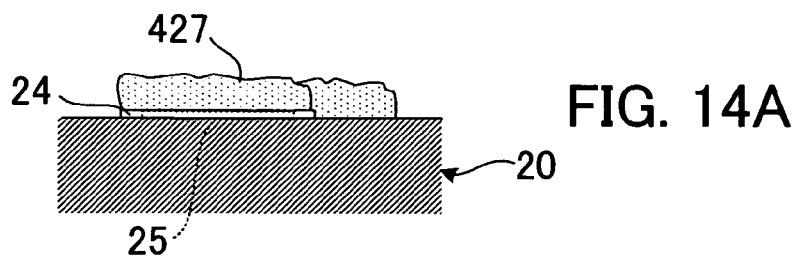
FIG. 14 illustrates a flow of a mounting process of an integrated circuit component.
Figure 14B:
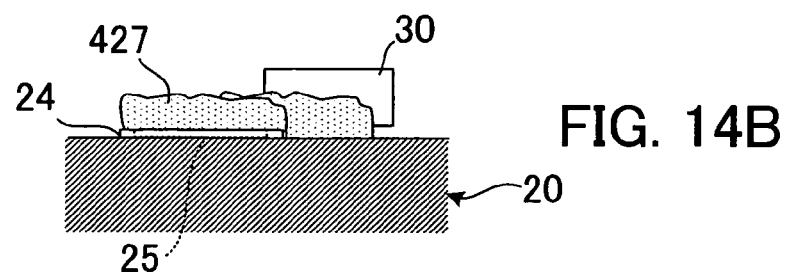

Turning now to FIG. 14, subsequently, the bypass capacitor 30 is placed on the solder pastes 427 (FIG. 14B). At this time, the bypass capacitor 30 is placed in a position at a predetermined distance from the footprints 25. In the present embodiment, the bypass capacitor 30 is disposed away from the solder pastes 427 at a distance of about one fourth the width of the bypass capacitor 30 as shown in FIG. 13D.

Figure 14C:
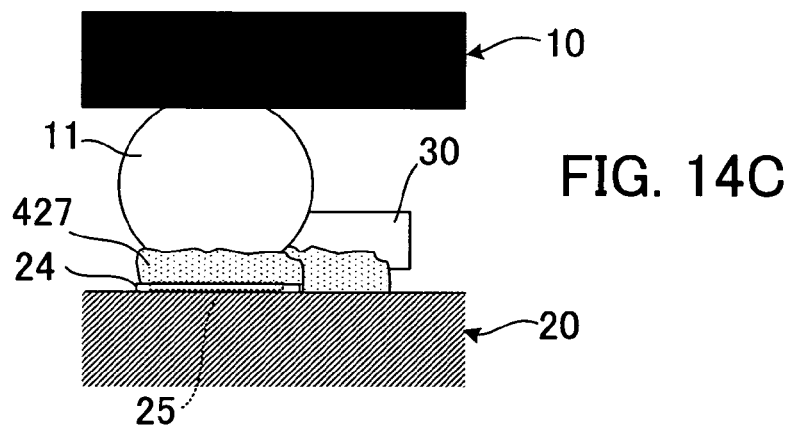

Turning now to FIG. 14, then, the LSI chip 10 is mounted such that each of the solder bumps 11 is placed on the solder paste 427 (FIG. 14C). At this time, the bypass capacitor 30 is mounted between the wiring board 20 and the LSI chip 10 so as to be covered by the LSI chip 10. On this occasion, a positional relationship between the bypass capacitor 30 and the solder bumps 11 is set such that the capacitor 30 is prevented from coming into contact with each of the adjacent solder bumps 11.

Figure 14D:
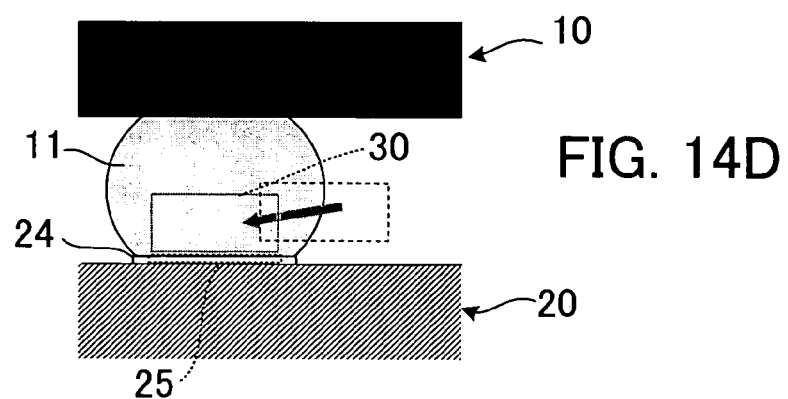
Figure 15A:
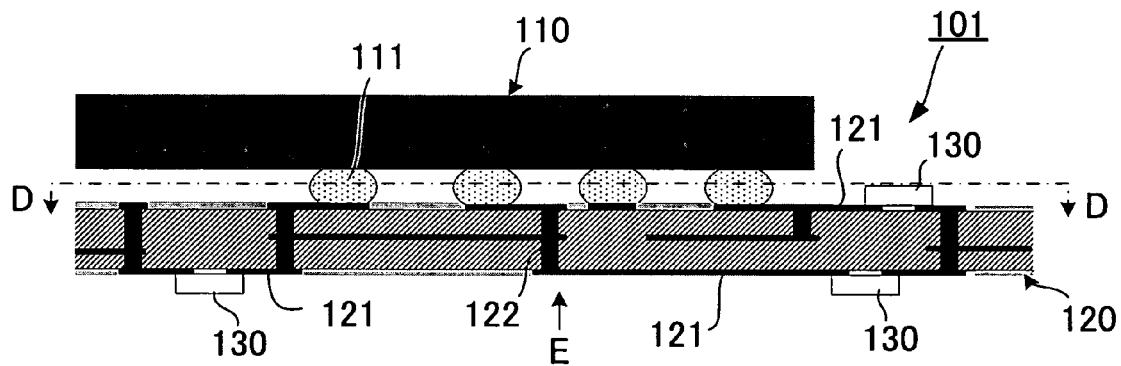
FIG. 15 illustrates a mounting structure of a conventional integrated circuit component.
Figure 15B:
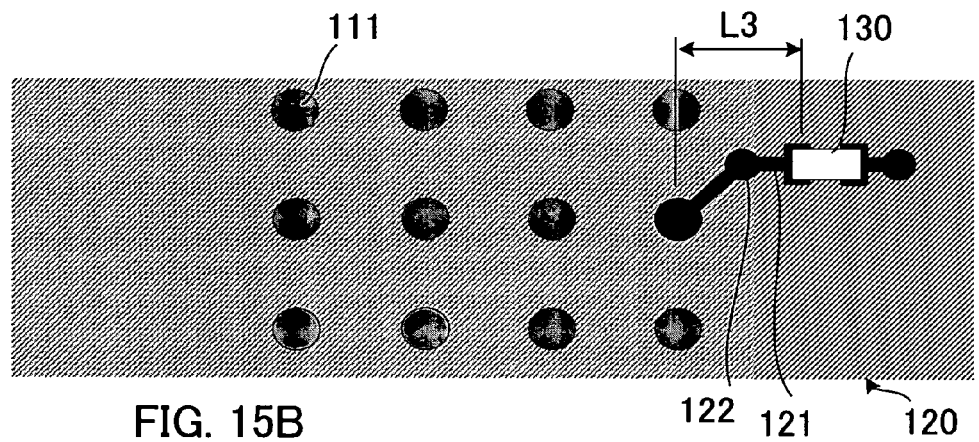
Figure 15C:
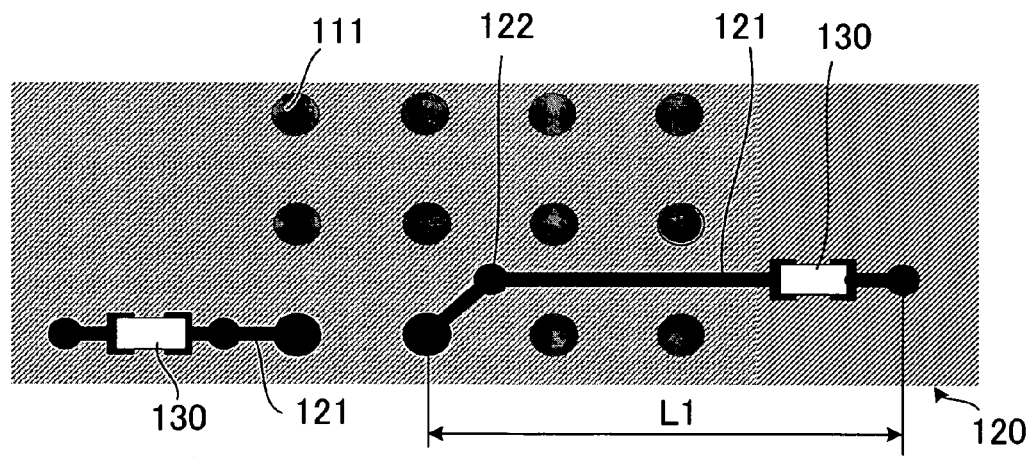
Figure 16A:
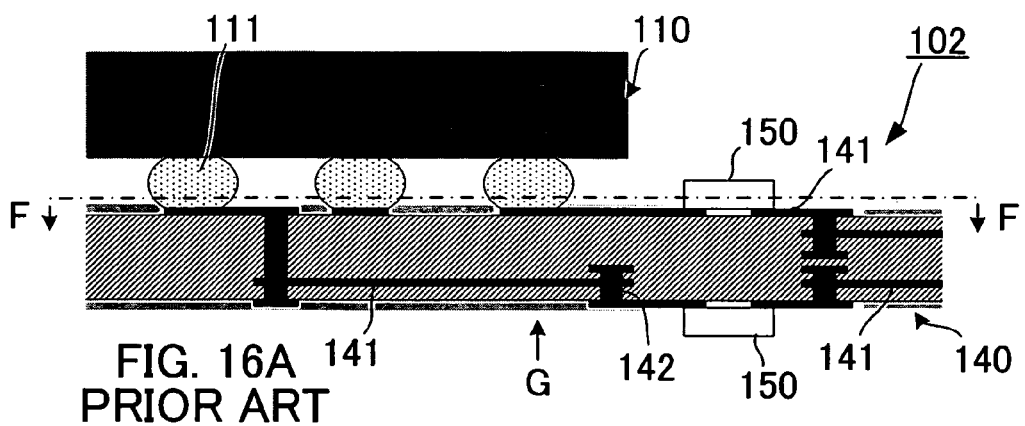
FIG. 16 illustrates a mounting structure of a conventional integrated circuit component.
Figure 16B:
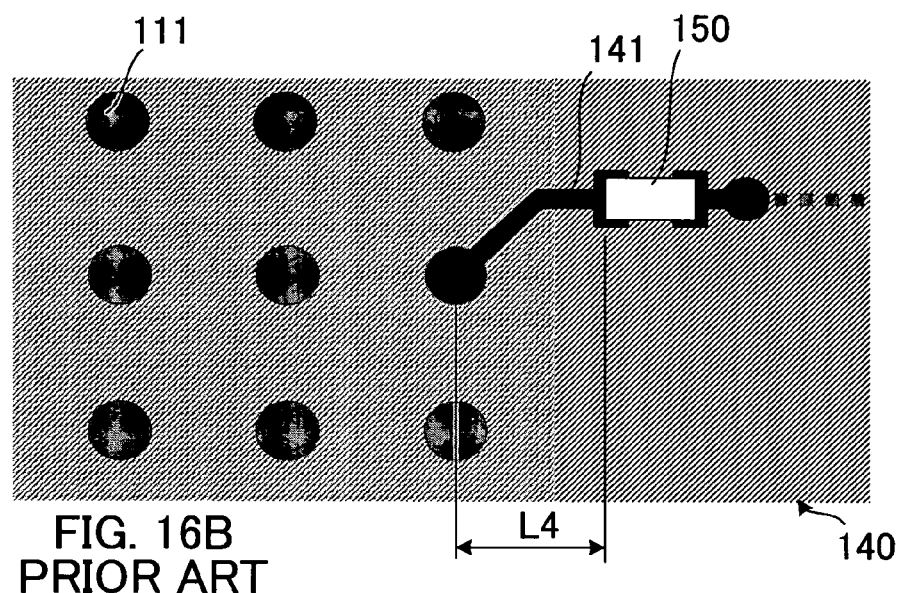
Figure 16C:
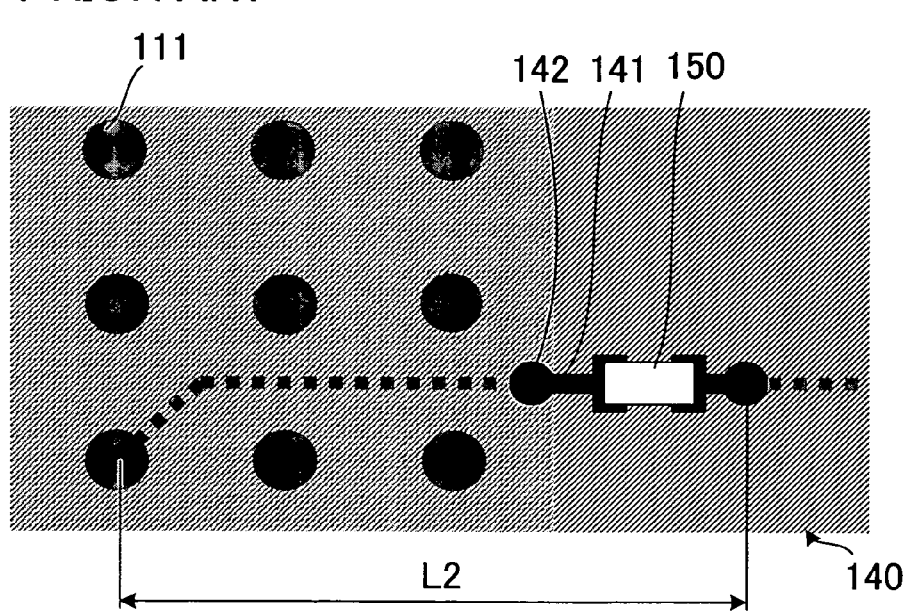
Figure 17A:
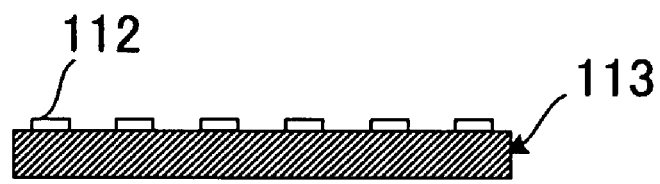
FIG. 17 illustrates a manufacturing process of an integrated circuit module.
Figure 17B:
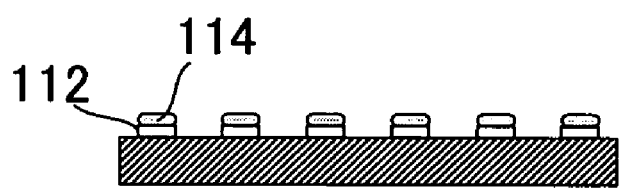
Figure 17C:
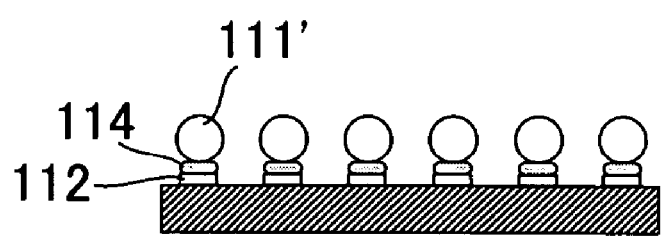
Figure 17D:
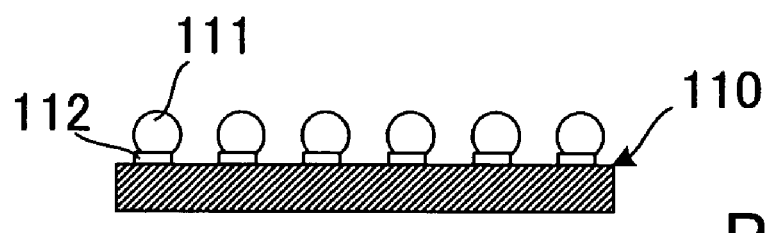
Figure 18A:
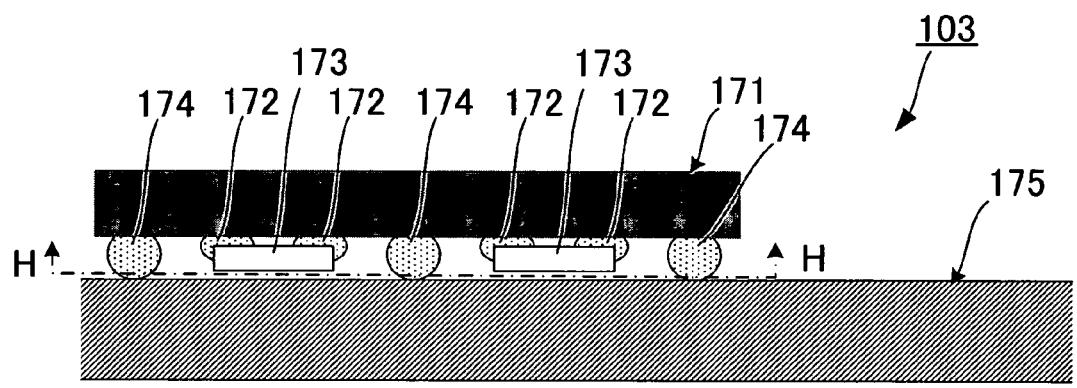
FIG. 18 is a sectional view showing an outline of a capacitor mounting structure according to a conventional example.
Figure 18B:
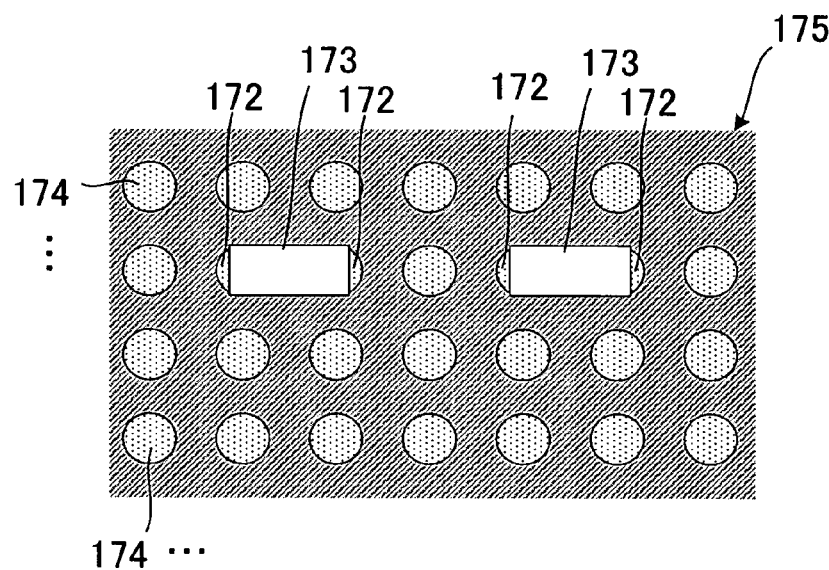
Figure 19A:
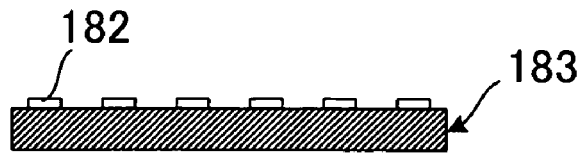
FIG. 19 illustrates a manufacturing process of an integrated circuit module having a capacitor mounting structure according to a conventional example.
Figure 19B:
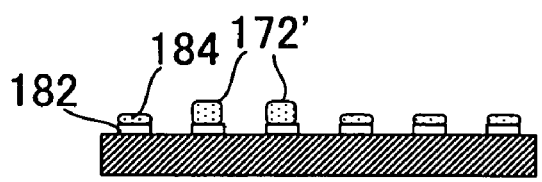
Figure 19C:
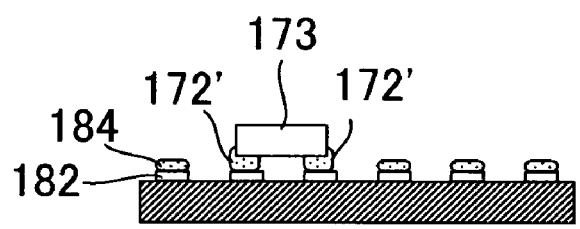
Figure 19D:
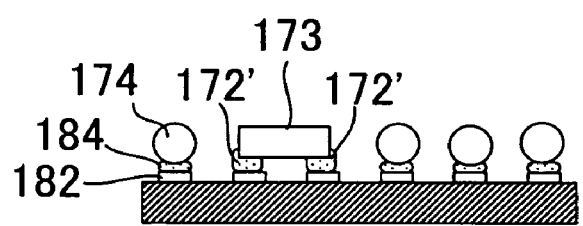
Figure 19E:
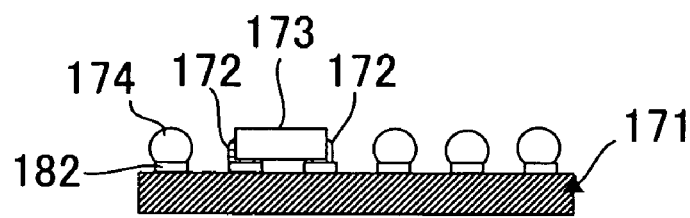
Figure 20A:
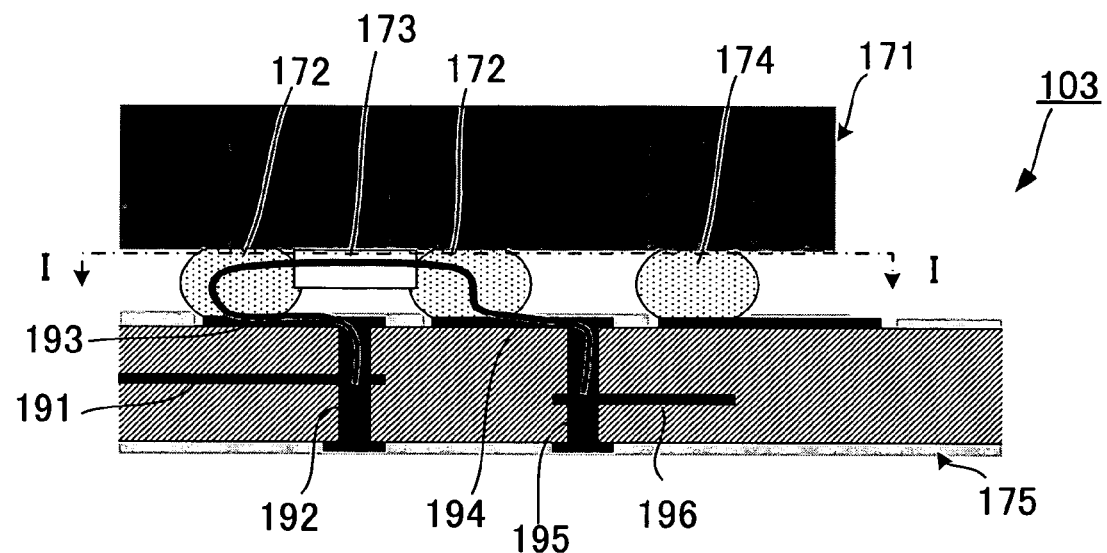
FIG. 20 illustrates problems according to a conventional example.
Figure 20B:
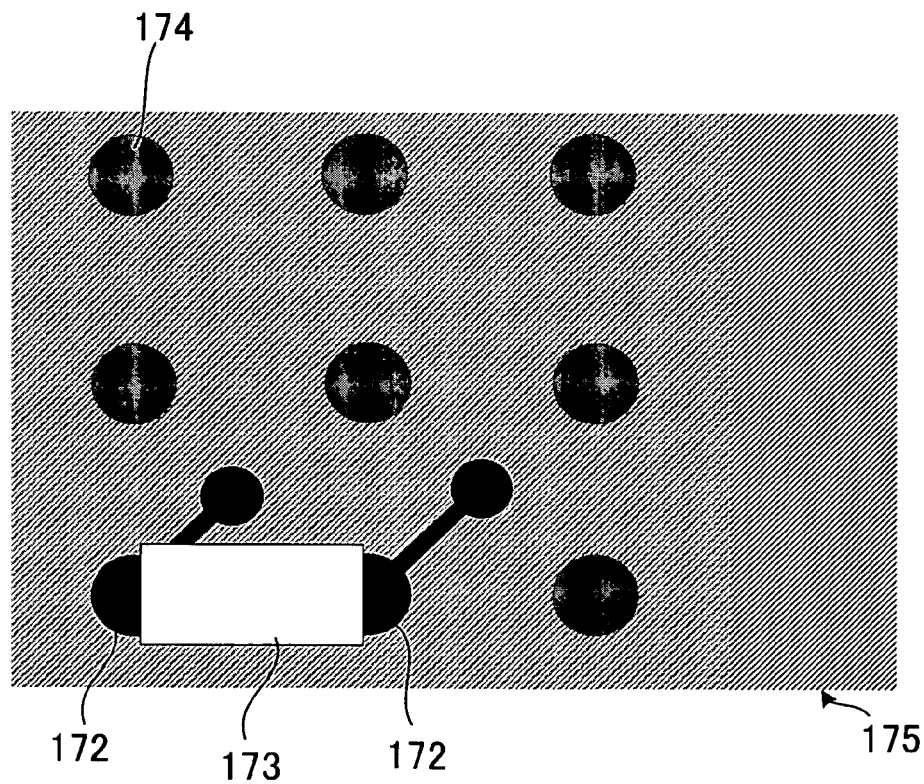

Further, the solder paste 427 is melted and reflowed. At this time, as indicated by an arrow in the figure, the bypass capacitor 30 is automatically moved to a predetermined position of the footprint 25 by the self-alignment due to surface tension of solder during the reflow and bonded to the wiring board (FIGS. 14D and 13D).

Thus, mounting of the bypass capacitor 30 and the LSI chip 10 on the wiring board 20 is completed.

As described above, also in the integrated circuit component of the present embodiment, the bypass capacitor 30 is mounted on the wiring board 20 side of a gap between the wiring board 20 and the LSI chip 10. Therefore, the same effect as in the first embodiment can be obtained.

Further, the integrated circuit component of the present embodiment has a constitution such that the bypass capacitor 30 is mounted in a proper position in the final stage of the reflow step. Therefore, even in the case where the bypass capacitor 30 somewhat interferes with the solder bumps 11 when being mounted as in the first embodiment, the bypass capacitor 30 and the LSI chip 10 can be mounted in a proper position in the final stage of the reflow step. As a result, a bypass capacitor 30 larger than that of the first embodiment can be mounted.

Also in the present embodiment, an example of mounting the bypass capacitor 30 as the chip part is given. Further, the present embodiment is similarly applicable also to a case of mounting other chip parts such as a damping resistor.

As long as the integrated circuit component has a constitution that the chip part which adjusts impedance of the wiring patterns is mounted between the wiring board and the integrated circuit module, the present embodiment is applicable.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. An integrated circuit component, comprising:
    an integrated circuit module with an external terminal formed by a plurality of metal bumps;
    a wiring board having a plurality of wiring patterns and an external connecting terminal to be connected to a part of the wiring patterns, the wiring board mounting thereon the integrated circuit module by connecting the metal bumps to the external connecting terminal; and
    a chip part which adjusts impedance of the wiring patterns, the chip part being mounted on the wiring board side of a gap between the wiring board and the integrated circuit module so as to be mounted between adjacent metal bumps among the plurality of metal bumps, wherein
    the plurality of metal bumps are aligned in a lattice form, and
    the adjacent metal bumps are obliquely adjacent metal bumps.

2. The integrated circuit component according to claim 1, wherein:
    the integrated circuit module is composed of a BGA-type LSI chip.

3. The integrated circuit component according to claim 1, wherein:
    the integrated circuit module and the chip part are bonded by reflow soldering to the wiring board through a metal paste mounted on the external connecting terminal of the wiring board.

4. The integrated circuit component according to claim 3, wherein:
the chip part is mounted such that electrode terminals thereof are connected to the respective metal pastes under the adjacent metal bumps and are prevented from coming into contact with the respective adjacent metal bumps at least before the reflow.

5. The integrated circuit component according to claim 1, wherein:
a fillet of a footprint as the external connecting terminal formed on a surface of the wiring board for mounting the chip part is provided only in a direction perpendicular to a direction connecting both electrodes of the chip part.

6. The integrated circuit component according to claim 1, wherein:
a footprint for mounting the chip part and a footprint on which the metal bumps are placed are integrally formed as the external connecting terminal formed on the surface of the wiring board.

7. The integrated circuit component according to claim 1, wherein:
the chip part is mounted in a position at a distance from an axis line along an adjacent direction of the adjacent metal bumps.

8. A method for mounting, on a wiring board having a plurality of wiring patterns and an external connecting terminal to be connected to a part of the wiring patterns, an integrated circuit module with an external terminal formed by a plurality of metal bumps and a chip part which adjusts impedance of the wiring patterns, comprising the steps of:
forming as the external connecting terminal of the wiring board a footprint, between any adjacent footprints on which the metal bumps are placed, for mounting the chip part so as to be disposed in a gap between the wiring board and the integrated circuit module;
simultaneously mounting metal pastes on the respective footprints;
mounting the chip part on the metal pastes;
mounting the integrated circuit module on the metal pastes through the metal bumps so as to cover the chip part; and
melting the metal pastes to bond the integrated circuit module and the chip part to the wiring board by reflow, wherein
the metal bumps are aligned in a lattice form, and
the adjacent footprints are obliquely adjacent footprints.

9. The method according to claim 8, wherein:
a positional relationship between the footprint for mounting the chip part and the footprint to which the metal bumps are adjacent is set such that the chip part is prevented from coming into contact with each of the adjacent metal bumps at least before the reflow step.

10. The method according to claim 8, wherein:
in the footprint forming step, the footprint for mounting the chip part is formed in a position at a distance from an axis line along an adjacent direction of the footprint to which the metal bumps are adjacent.

11. The method according to claim 8, wherein:
the chip part is previously placed at a distance from the footprint for mounting the chip part and is automatically moved to a predetermined position of the footprint by self-alignment during the reflow step so as to be bonded to the wiring board.

12. The method according to claim 8, wherein:
in the paste mounting step, the metal pastes are mounted up to a position at a predetermined distance from the footprint for mounting the chip part to allow the chip part to be placed; and
in the chip part mounting step, the chip part is automatically moved to a predetermined position of the footprint by self-alignment during the reflow step so as to be bonded to the wiring board.

\* \* \* \* \*